US007014731B2

(12) United States Patent
Farquhar et al.

(10) Patent No.: US 7,014,731 B2
(45) Date of Patent: Mar. 21, 2006

(54) SEMICONDUCTOR DEVICE HAVING A THERMOSET-CONTAINING DIELECTRIC MATERIAL AND METHODS FOR FABRICATING THE SAME

(75) Inventors: Donald S. Farquhar, Endicott, NY (US); Konstantinos I. Papathomas, Endicott, NY (US); Mark D. Poliks, Vestal, NY (US)

(73) Assignee: International Business Machines Corporation, Armonk, NY (US)

( * ) Notice: Subject to any disclaimer, the term of this patent is extended or adjusted under 35 U.S.C. 154(b) by 56 days.

(21) Appl. No.: 09/781,730

(22) Filed: Feb. 12, 2001

(65) Prior Publication Data

US 2001/0041389 A1    Nov. 15, 2001

Related U.S. Application Data

(62) Division of application No. 09/343,079, filed on Jun. 29, 1999, now Pat. No. 6,254,972.

(51) Int. Cl.
*C09J 5/02* (2006.01)
(52) U.S. Cl. .................... 156/307.5; 156/307.7
(58) Field of Classification Search ............ 156/272.6, 156/275.5, 307.3, 307.5, 307.7
See application file for complete search history.

(56) References Cited

U.S. PATENT DOCUMENTS

| 3,713,870 | A | * | 1/1973 | Kaye ...................... 427/383.1 |
| 3,953,566 | A | | 4/1976 | Gore |
| 4,153,661 | A | * | 5/1979 | Ree et al. ................... 264/120 |
| 4,590,539 | A | * | 5/1986 | Sanjana et al. ............. 361/760 |
| 4,634,631 | A | | 1/1987 | Gazit et al. |
| 4,670,089 | A | * | 6/1987 | Hanson .................... 156/307.1 |
| 4,697,923 | A | * | 10/1987 | Jones et al. ............... 356/237.5 |
| 4,747,897 | A | * | 5/1988 | Johnson ...................... 156/148 |
| 4,765,860 | A | * | 8/1988 | Ueno et al. ............... 156/272.6 |
| 4,849,284 | A | | 7/1989 | Arthur et al. |
| 4,886,699 | A | | 12/1989 | Carroll et al. |
| 4,996,097 | A | | 2/1991 | Fischer |
| 5,024,871 | A | | 6/1991 | Arthur et al. |
| 5,055,342 | A | | 10/1991 | Markovich et al. |
| 5,103,293 | A | | 4/1992 | Bonafino et al. |
| 5,309,629 | A | | 5/1994 | Traskos et al. |
| 5,319,244 | A | | 6/1994 | Papathomas et al. |
| 5,358,775 | A | | 10/1994 | Horn, III |
| 5,374,453 | A | * | 12/1994 | Swei et al. ................. 427/226 |
| 5,374,469 | A | | 12/1994 | Hino et al. |
| 5,422,184 | A | | 6/1995 | Papathomas |
| 5,425,832 | A | * | 6/1995 | Kusano et al. ............ 156/272.6 |
| 5,506,049 | A | | 4/1996 | Swei et al. |

(Continued)

FOREIGN PATENT DOCUMENTS

JP          02145335 A    *   6/1990

OTHER PUBLICATIONS

English abstract for JP 02145335.*

(Continued)

*Primary Examiner*—Jeff H. Aftergut
*Assistant Examiner*—John L. Goff
(74) *Attorney, Agent, or Firm*—Schmeiser, Olsen & Watts; William H. Steinberg

(57) ABSTRACT

A semiconductor device having a thermoset-containing, dielectric material and methods for fabricating the same is provided. The device may take the form of a printed circuit board, an integrated circuit chip carrier, or the like. The dielectric material is a non-fibrillated, fluoropolymer matrix that has inorganic particles distributed therein and is impregnated with a thermoset material.

6 Claims, 7 Drawing Sheets

U.S. PATENT DOCUMENTS

| | | | |
|---|---|---|---|
| 5,652,055 A | | 7/1997 | King et al. |
| 5,656,862 A | | 8/1997 | Papathomas et al. |
| 5,686,191 A | | 11/1997 | Miwa et al. |
| 5,756,405 A | | 5/1998 | Appelt et al. |
| 5,762,741 A | * | 6/1998 | Kodokian ............... 156/153 |
| 5,858,461 A | | 1/1999 | Appelt et al. |
| 6,013,588 A | | 1/2000 | Ozaki |

OTHER PUBLICATIONS

"Computer-Controlled Optical Testing of High-Density Printec-Circuit Board", 1983, IBM J. Res. Develop. vol. 27, pp. 50-58.*

"High Performance Carrier Technology: Materials and Fabrication", by Light et al., 1993 International Electronics Packaging Conference, San Diego, California, Volume One.

"High Performance Carrier Technology", by Heck et al., 1993 International Electronics Packaging Conference, San Diego, California, Volume One.

"Process Considerations in the Fabrication of Teflon Printed Circuit Boards", by Light et al., 1994 Proceedings, 44 Electronic Components & Technology Conference, May 1994.

* cited by examiner

SEMICONDUCTOR DEVICE HAVING A THERMOSET-CONTAINING DIELECTRIC MATERIAL AND METHODS FOR FABRICATING THE SAME

This application is a divisional of Ser. No. 09/343,079, filed on Jun. 29, 1999, now U.S. Pat. No. 6,254,972.

BACKGROUND OF THE INVENTION

1. Technical Field

The present invention generally relates to a printed wiring board or semiconductor device having a thermoset-containing, dielectric material and methods for fabricating the same, and more particularly, to a structure and method for fabricating a dielectric material for use in a high performance semiconductor device.

2. Background Art

In the production of organic laminate chip carriers for packaging, dielectric materials are required between the electrically conductive layers. Optimal characteristics for the dielectric layers include: (1) a low dielectric constant; (2) thin layers; (3) dimensional stability; (4) a low coefficient of thermal expansion (CTE); (5) good adhesion to the surrounding conductive layers; (6) ease of processing; and (7) laser drillability.

Heretofore, many have attempted to develop suitable materials, but have fallen short. One such example of this is shown in U.S. Pat. No. 5,506,049 to Swei et al., hereby incorporated by reference. Swei et al. teaches the use of a silica filled polytetrafluoroethylene (PTFE) matrix as a dielectric. Specifically, Swei et al. casts a silica filled PTFE matrix from a dispersion which results in a non-fibrillated structure. Although this structure exhibits adhesion to the surrounding layers, it has been shown to be both dimensionally unstable (exhibiting as much as 20% reduction in thickness) as well as costly and time consuming to process (due to the high temperatures and pressures required to laminate).

Another example of a related material is taught in U.S. Pat. No. 5,652,055 to King et al., hereby incorporated by reference. King et al. teaches the use of an expanded polytetrafluoroethylene (EPTFE) matrix having ceramic particles and thermosetting resin therein. It is easier to process than the dielectric of Swei et al. because the thermosetting resin can be cured at conventional lamination temperatures. It is also easier to handle than the material of Swei et al. because it has a higher strength. However, the material of King et al. has less ability to re-distribute stresses within the package due to its relatively high elastic modulus.

Therefore, there exists a need for a dielectric material that is: (1) suitable for use in high performance chip carriers; (2) does not require the high temperatures and pressures for lamination of the Swei et al. material; and (3) is cost effective to manufacture. More particularly, there exists the need for a dielectric material that provides optimal characteristics. Such characteristics include: (1) a low dielectric constant; (2) reduced thickness; (3) dimensional stability; (4) a low coefficient of thermal expansion (CTE); (5) good adhesion to the surrounding conductive layers; (6) ease of processing; and (7) laser drillability.

SUMMARY OF THE INVENTION

The present invention overcomes the deficiencies of the related art by providing a semiconductor device that includes a thermoset-containing, non-fibrillated dielectric material having inorganic particles distributed therein and methods for fabricating the same such that the dielectric material has the above-cited optimal characteristics.

According to one aspect of the present invention, a combination is provided that includes: a fluoropolymer matrix having particles distributed therein; and a thermosetting resin.

According to a second aspect of the present invention, a device is provided that includes: a conductive layer; a polytetrafluoroethylene matrix, containing particles therein, overlaying the conductive layer; and a thermosetting resin, for bonding the conductive layer to the polytetrafluoroethylene matrix.

According to a third aspect of the present invention, a method for forming a device is provided. The method includes the following steps: providing a fluoropolymer matrix having particles therein; providing a thermosetting resin; and laminating the fluoropolymer matrix to a conductor using the thermosetting resin.

According to a fourth aspect of the present invention, a method for forming a device is provided. The method includes the following steps: providing a fluoropolymer matrix having particles therein; coating the fluoropolymer matrix with a thermosetting resin; and laminating the coated fluoropolymer matrix to a conductor.

It is therefore an advantage of the present invention to provide a semiconductor device having a thermoset-containing, dielectric material and methods for forming the same.

It is therefore an advantage of the present invention to provide a structure and methods for fabricating a dielectric material, that includes a thermoset, and that has optimal characteristics.

BRIEF DESCRIPTION OF THE DRAWINGS

These and other features and advantages of this invention will be more readily understood from the following detailed description of the various aspects of the invention taken in conjunction with the accompanying drawings in which.

Figure 1:
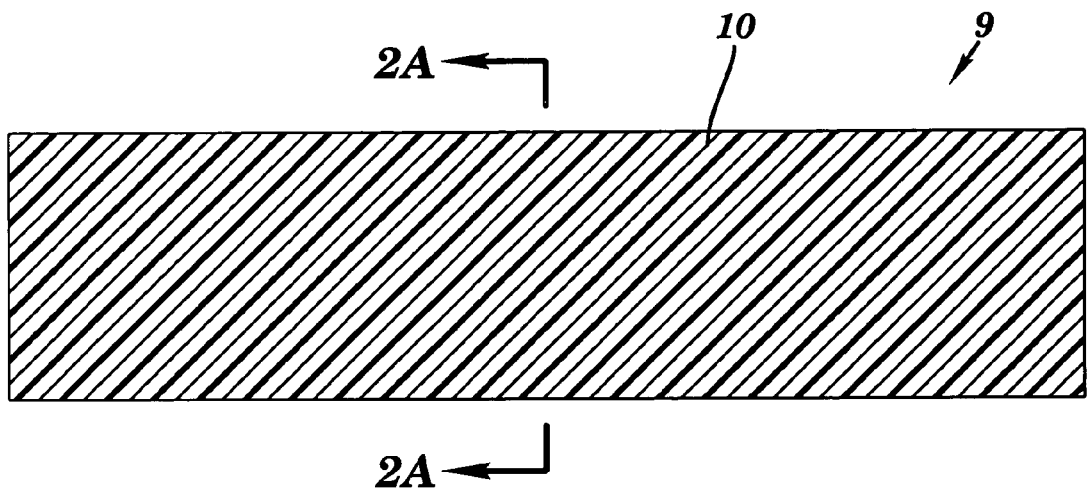
FIG. 1 is a side view of an article according to the present invention.

It is noted that the drawings of the invention are not to scale. The drawings are merely schematic representations, not intended to portray specific parameters of the invention. The drawings are intended to depict only typical embodiments of the invention, and therefore should not be considered as limiting the scope of the invention. In the drawings, like numbering represents like elements between the drawings.

DETAILED DESCRIPTION OF THE PREFERRED EMBODIMENTS

Figure 2A:
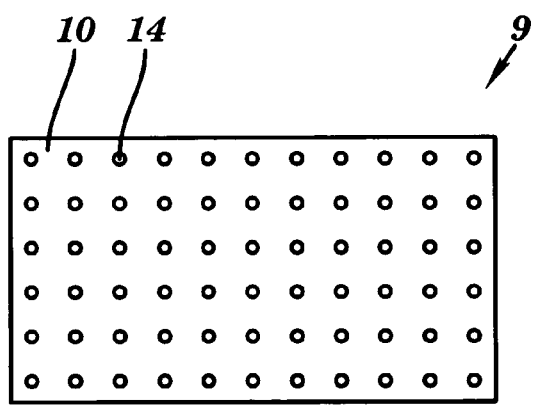
FIG. 2A is a cross-sectional view of the article of FIG. 1, according to the present invention.

Referring now to the drawings, FIGS. 1 and 2A show a particle filled body 9. Filled body 9 comprises a fluoropolymer matrix 10 having inorganic particles 14 distributed therein. The inorganic particles 14 preferably comprise about 15% to about 95% of the volume of the filled body 9. Moreover, the fluoropolymer matrix 10 is nonfibrillated and is preferably polytetrafluoroethylene, however, it should be appreciated that many equivalents exist. For example, the fluoropolymer matrix 10 can be polychlorotrifluoroethylene, or fluorinated copolymers.

Examples of fluorinated copolymers include: (1) copolymers of tetrafluoroethylene with a monomer selected from the group consisting of hexafluoropropylene and perfluoroalkylvinylethers; (2) copolymers of tetrafluoroethylene with a monomer selected from the group consisting of vinylidene fluoride, vinyl fluoride and ethylene; and (3) copolymers of chlorotrifluoroethylene with a monomer selected from the group consisting of hexafluoropropylene, perfluoroalkylvinylethers, vinylidene fluoride, vinyl fluoride and ethylene. In addition, blends of the above listed fluoropolymers are also suitable as the fluoropolymer matrix 10 material of the present invention.

The inorganic particles 14 which fill the nonfibrillated fluoropolymer matrix 10 are preferably silica. However, it should be understood that many other inorganic particles are suitable as well. Such inorganic particles may include glass particles, ceramic particles, metallic particles, carbon particles, mineral particles, or any combination thereof. In addition, the inorganic particles 14 are preferably spherical in shape and have a diameter of less than about 10 microns and preferably, a diameter of about 5 microns.

As shown in FIG. 2A, the inorganic particles 14 are evenly distributed throughout the fluoropolymer matrix 10. Such distribution is preferably accomplished by casting the filled body 9 from a dispersion in which both the fluoropolymer matrix 10 and the inorganic particles 14 are introduced in the form of liquids.

The filled body 9, containing the mixture of the fluoropolymer matrix 10 and the inorganic particles 14 as described, is available from the Rogers Corporation of Rogers, Conn. As indicated above, however, the filled body 9 is difficult to process because, inter alia, of the high pressure and temperature requirements for lamination of the filled body 9 to or within a printed wiring board or laminate chip carrier device.

Figure 2B:
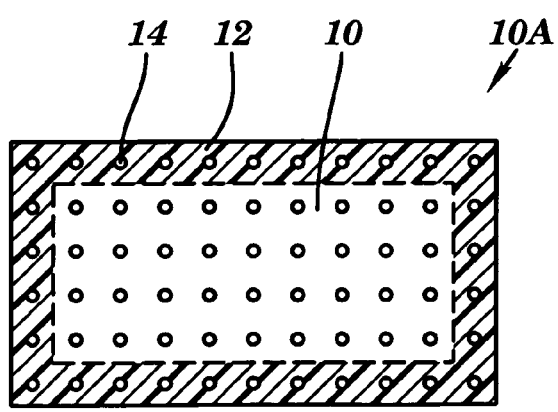
FIG. 2B is a cross-sectional view of the article of FIG. 1 with the addition of a thermosetting material, according to the present invention.

It has been discovered, however, that when the filled body 9 is impregnated or coated (integrated) with a thermoset material, such problems are eliminated. Such impregnation or coating can be accomplished by at least four distinct methods. Specifically, the thermosetting material can be: (1) applied to the un-densified filled body, which has not been laminated, in the form of a varnish and then subsequently partially dried or cured to form an impregnated core material or article 10A, as shown in FIG. 2B; (2) coated onto a filled body that is in a densified state where it is part of a partially fabricated printed wiring board of laminate chip carrier; (3) coated onto a metal conductive layer which is then laminated to the filled body 9; or (4) cast in a dispersion during the original formation of the filled body 9.

The thermoset material is preferably a thermosetting resin 12 that serves to optimize the characteristics of the filled body 9. In particular, the thermosetting resin 12 is preferably an epoxy such as a cycloaliphatic type epoxy, a digycidyl ether of bisphenol A, cresol novolaks, phenolic epoxies, polyimides, bismaleimides, bismaleimides-triazine epoxies, or a cyanate ester-epoxy mixture, however it should be appreciated that many equivalents exist.

FIG. 2B depicts the article 10A constructed in accordance with the first of the above four methods. Specifically, the thermosetting resin is preferably made into a varnish, prior to impregnation into the filled body 9, with the addition of a low molecular weight solvent, such as methyl ethyl ketone or the like. The varnish generally comprises approximately 30–75% by weight solids. In addition, the thermosetting resin 12 can include inorganic particles, such as the silica present in the fluoropolymer matrix 10, as well as a contrasting dye or pigment. If inorganic particles are present, they will not penetrate into the filled body 9 as the thermosetting resin 12 does, rather, the particles will remain along the outer surfaces of the filled body 9. In addition, contrasting dye or pigment can be included in the varnish if enhanced optical contrast or fluorescence with respect to conductive layers is sought.

Once the solvent has been added to the thermosetting resin 12, the varnish is applied or coated onto the surface of the filled body 9 in its un-densified state in which it has not been laminated. The coating can be accomplished by any number of known methods such as doctor blading, wire rod, roll coating, screen coating, or spraying. In addition, the degree to which the coating penetrates the filled body 9 can be controlled by the viscosity of the varnish. Once the filled body 9 has been coated with the varnish, the coated filled body 9 is then subjected to a drying to remove the solvent, commonly referred to as a b-staging operation. A b-staging operation is known to those of ordinary skill in the art and includes the heating of the coated filled body 9 to a level sufficient to remove the solvent from the varnish and to partially cure or cross-link the thermosetting resin 12. Accordingly, only the thermosetting resin 12 remains coated on the filled body 9 and is partially cured. This results in a core material or article 10A that has resin 12 impregnated therein and is tack free to the touch of a user.

Optionally, the filled body 9 can be subjected to a plasma process prior to its coating with the varnish. A plasma process texturizes the surface of the filled body 9 and aids in improving wettability and adherence of the varnish to the filled body 9. In some instances where a plasma process was not performed, the thermosetting resin formed beads along the surfaces of the filled body 9 and did not form a uniform coating.

FIG. 2B shows a completed article 10A constructed as described above. As shown, the article 10A includes the inorganic particles 14 evenly distributed throughout the fluoropolymer matrix 10 (collectively referred to as the filled body 9) and the thermosetting resin 12 impregnated therein. The depth of impregnation of the thermosetting resin 12 within the article 10A is up to approximately 0.001 inches, and the overall thickness of filled body 9 is approximately 0.005 inches, however, it should be appreciated that this thickness may vary.

Figure 3:
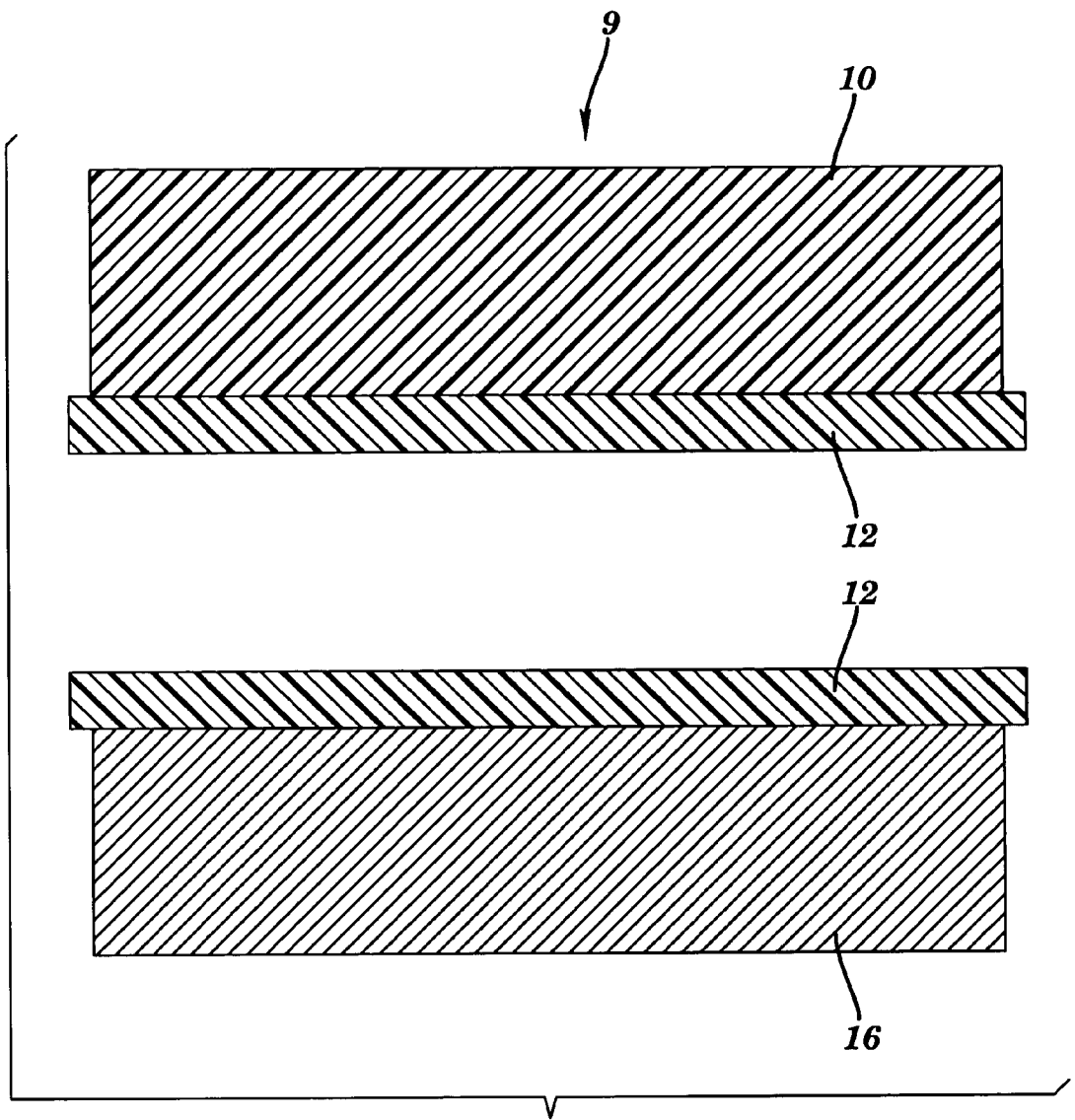
FIG. 3 is a side view of a device according to the present invention.

Referring now to FIG. 3, two additional methods for applying the thermosetting resin 12 to the filled body 9 are shown. First, the thermosetting resin 12 or varnish can be coated onto a surface of the filled body 9 in its densified state in which it is part of a partially fabricated printed wiring board or laminate chip carrier (not shown in FIG. 3). The specific surface to which the thermosetting resin 12 will be applied depends on the needs of the user. For example, the thermosetting resin 12 can be applied to either the top surface, the bottom surface (as shown), or both. After the coating has been applied, the coated filled body 9 will then be laminated to metal conductive layer 16. After lamination, the filled body 9 will have thermosetting resin impregnated therein and appear similar to the article 1A shown in FIG. 2B. However, it should be appreciated that the uniformity and depth of impregnation of the thermosetting resin 12 may vary.

Also shown in FIG. 3 is a third method of integrating the filled body 9 with the thermosetting resin 12, namely, the coating of the metal conductive layer 16 with the thermosetting resin 12. Once again, the precise surface of the conductive layer 16 which will be coated will vary depending on the needs of the user. Moreover, in coating the conductive layer 16, it may not be necessary to also coat the filled body 9 with thermosetting resin 12, although it could be done if enhanced adhesion was desired. Conductive layer 16 is preferably metal such as copper, however, it should be appreciated that many metals could be used. Examples of suitable metals include nickel, chrome, or aluminum. Once the conductive layer 16 has been coated, the filled body 9 is then laminated thereto, as would be done in any printed circuit board or chip carrier. Similar to the method of coating the filled body 9 with the thermosetting resin 12, the lamination would result in impregnation of the thermosetting resin 12 within the filled body, similar to that shown in FIG. 2B. However, such impregnation would vary in uniformity and depth.

A fourth way to integrate the filled body 9 with the thermosetting resin 12 is to cast the thermosetting resin 12 or varnish in a dispersion, along with the liquidized fluoropolymer matrix 10, also a dispersion, and inorganic particles 14, during the original formation of the filled body 9. This method of integration would also result in the impregnation of thermosetting resin 12 throughout the filled body 9. However, similar to the above methods, the uniformity and depth of thermosetting resin 12 impregnation would vary from method to method.

In all of the above methods the integration of thermosetting resin 12 results in optimal performance characteristics of the dielectric material in addition to easier processing. For example, the lamination process does not require the high temperatures and pressures normally required with such materials. In contrast, the lamination process need only be to a temperature of 120–250° C. and a pressure of 100–700 psi.

Figure 4:
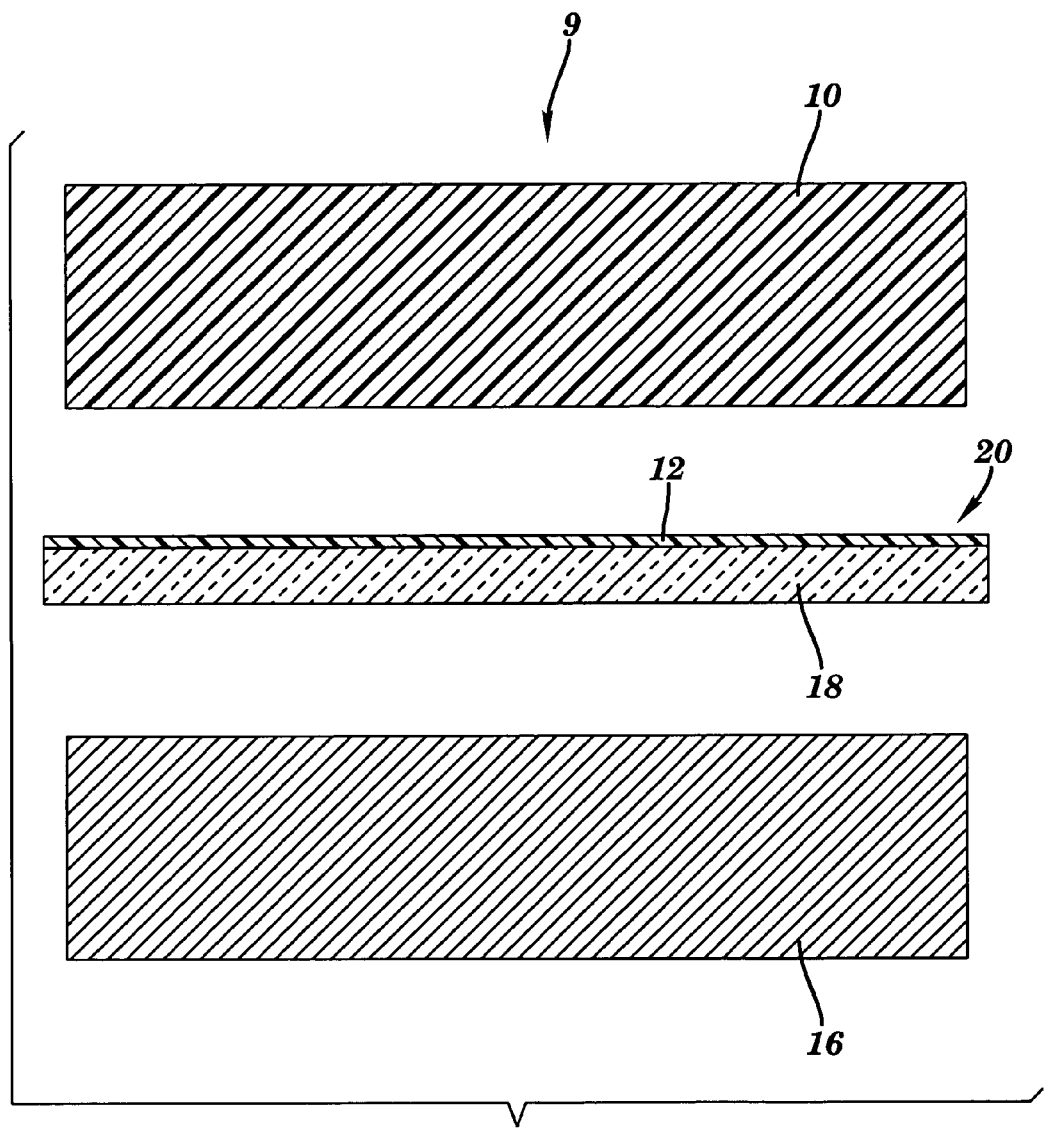
FIG. 4 is a side view of an alternative embodiment of a device according to the present invention.

It should also be appreciated that other alternatives exist for coating either the filled body 9, or the conductive layer 16 with the thermosetting resin 12. For example, FIG. 4 shows that the thermosetting resin 12 can be provided in a sheet 20 and resin 12 can be transferred to the filled body 9 and/or the conductive layer 16 prior to lamination. In this case, the thermosetting resin is provided on a free standing layer 18 of MYLAR or the like. Preferably, the free standing layer 18 is approximately ½ mil or 1 mil in thickness. Once the sheet 20 is positioned between the filled body 9 and the conductive layer 16, the Mylar can be peeled off or removed and the coated filled body 9 can be laminated to the conductive layer 16 at the reduced temperature of 120–250° C. and pressure of 100–700 psi. Again, this results in an article 10A having thermosetting resin 12 impregnated therein.

Figure 5:
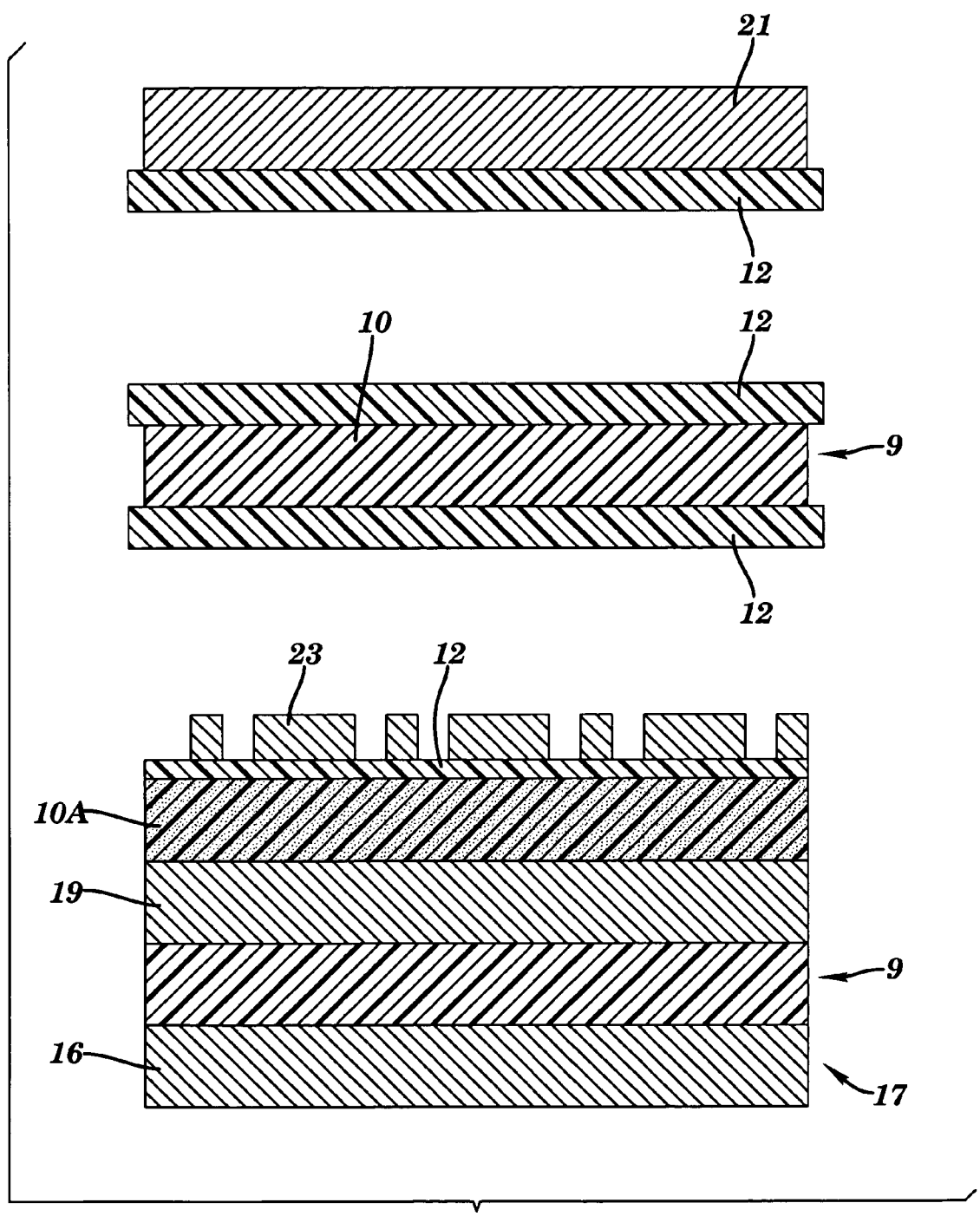
FIG. 5 is a side view of an alternative embodiment of a device according to the present invention.

FIG. 5 shows the use of both the article 10A and the coated filled body 9 in a partially completed printed circuit board 17. Specifically, the partially completed printed circuit board 17 includes multiple conductive layers 16, 19 and 23 having dielectric layers (article 10A and filled body 9), therebetween. Conductive layers 16 and 19 are shown as continuous, however, it should be appreciated that layers 16 and 19 could be patterned to form circuit lines. To fabricate the printed circuit board 17, a user would first provide a conductive layer 16 which would positioned adjacent to a dielectric such as filled body 9. Filled body 9 and article 10A are formed as described above. Specifically, filled body 9 is formed by casting a fluoropolymer matrix with inorganic particles in a dispersion while article 10A is formed by coating a filled body 9 with a varnish and then b-staging to provide a partially densified article 10A.

As indicated above, the filled body 9 does not include the thermosetting resin 12 and accordingly, it will be necessary to coat the bottom surface of the article 9 or the top surface of the conductive layer 16, or both, with the thermosetting resin 12. This is to avoid the alternative of high temperature lamination at 1500 psi and 350° C. to achieve the bonding of filled body 9 with conductive layers 16 and 19. Such coating can be performed using any known method such as those described above. For example, the coating can be accomplished by doctor blading, wire rod, roll coating, screen coating, spraying or by interposing the sheet 20.

Once the filled body 9 is applied to the first conductive layer 16 with thermosetting resin 12 therebetween, an additional conductive layer 19 is layered over the top surface of the filled body 9. Again, it will be necessary to coat either the top surface of the filled body 9, the bottom surface of the conductive layer 19, or both with the thermosetting resin 12. At this point, the circuit elements 16, 9, and 19, with the required coatings of thermosetting resin 12 are formed into a single element by lamination as previously described. After lamination, conductive layers 16 and 19 can be patterned as required to form circuit elements of a partially completed printed wiring board of laminate chip carrier.

After lamination, an article 10A is then positioned over the conductive layer 19 to form an additional dielectric layer. However, unlike the filled body 9, the article is already impregnated with the thermosetting resin 12. Accordingly, there is no need to apply additional coatings of thermosetting resin 12 to either the article 9 or the conductive layer 19. Although it should be appreciated that a user is free to add additional coatings of thermosetting resin 12 to any of the layers 9 or 19 if enhanced adhesion is desired.

Finally, conductive layer 23 is placed over the article 10A. Similarly, it will not be necessary to coat the top surface of the filled body 10A or the bottom surface of the conductive layer 23 with the thermosetting resin 12. However, such coatings can be used if the user so desires.

Once all of the layers 16, 9, 19, 10A, and 23 have-been assembled as described or in a similar variation, the layers can be laminated using the reduced temperatures and pressures indicated above to form the printed circuit board 17 shown in FIG. 5. As previously indicated, the thermosetting resin 12 cures during lamination at the reduced temperature of 180° C. and pressure of 500 psi. After lamination, the thermosetting resin 12 is incorporated into both the filled body 9 and the article 10A. However, because the article 10A was impregnated with the thermosetting resin 12 before the lamination, the article 10A should exhibit an impregnation depth greater than the filled body 9.

Although the printed circuit board 17 has been shown with the filled body 9 and the article 10A, it should be understood that these materials can vary. For example, both dielectric layers of the printed circuit board 17 can be filled bodies 9, both can be articles 10A, or any combination thereof.

If a user wanted to add an additional conductive layer(s) 21 to the printed circuit board 17, they would follow the steps outlined above. For example, a user would coat the etched conductive layer 23 or the underside of the additional filled body 9, or both, with the thermosetting resin 12. Then, the additional filled body 9 would be positioned on top of the etched conductive layer 23. Next, to achieve adhesion of the additional conductive layer 21 to the additional filled body 9, the thermosetting resin 12 would be applied to the top side of the additional filled body 9 or the underside of the additional conductive layer 21, or both. Then, the additional conductive layer 21 would be placed on top of the additional filled body 9. Finally, the newly added layers 9 and 21 would be laminated to the printed circuit board 17 using the reduced temperatures and pressures described above, again resulting in impregnation of the filled body 9.

It should be understood, however, that in lieu of the additional filled body 9, an additional article 10A could be used. In this case, it would not be necessary to coat the additional article 10A or the conductive layers 23 and 21 with additional layers of thermosetting resin 12 because the article 10A is provided with resin already impregnated therein. However, as described above, a user is free to do so if enhanced adhesion is desired. Moreover, it should be appreciated that all applications of thermosetting resin 12, either in the printed circuit board 17 or in the subsequent addition of layers, could also be in the form of the sheet 20, as shown in FIG. 4.

Figure 6:
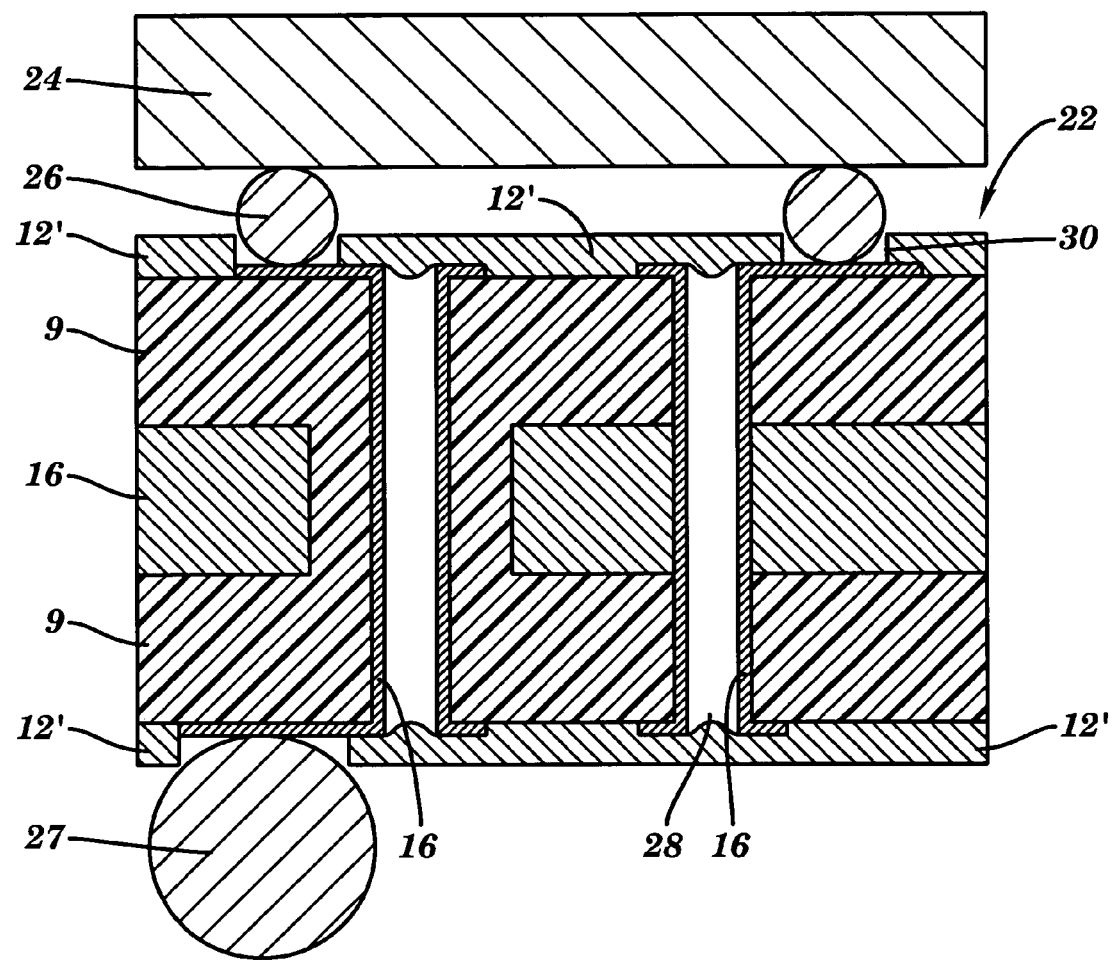
FIG. 6 is a side view of an alternative embodiment of a device according to the present invention.

FIG. 6 shows an integrated circuit chip carrier 22 that includes the coated filled body 9. The structure of the chip carrier 22 is generally known to those of ordinary skill in the art and although the precise form may vary, the chip carrier 22 of the present invention generally includes the following components: (1) dielectric layers including filled bodies 9; (2) electrically conductive layers 16; (3) plated through holes 28; (4) solder chip connectors 26; (5) ball grid array solder connector 27; (6) electrically conductive pads 30; and (7) thermosetting resin 12' now used as a solder mask. The integrated circuit chip 24 is coupled to the chip carrier 22 through the solder connectors 26.

The chip carrier 22 can be made in the same manner as the printed circuit board 17 described above. Specifically, the conductive layer(s) 16 is laminated to the filled bodies 9 using a thermosetting resin 12 (not shown). The various methods of coating the filled body 9 and/or the conductive layer 16 are the same as described above or the sheet 20 could be used. In addition, the resulting chip carrier 22 would include impregnation of the filled body 9 with thermosetting resin 12. As a further option, any of the filled bodies could be laminated without thermosetting resin 12 by using high pressure and high temperature lamination (1500 psi and 350° C.)

Solder mask 12' can be applied to the locations indicated in FIG. 6 by any of the means previously described. Preferably, solder mask 12' is applied above the electrically conductive pads 30 by means of laser ablation so that the electrically conductive pads are exposed for connection to solder chip connectors 26.

It should also be appreciated that an article 10A, with the thermosetting resin already impregnated therein, could be used in lieu of each layer of filled body 9. Again, in such a case, it would not be necessary to coat either the article(s) 10A or the conductive layer(s) 16 with additional thermosetting resin 12, although a user could do so for enhanced adhesion. The result of using either the articles or the coated filled bodies 9 in the chip carrier is that the dielectric characteristics are optimized. For example, similar to the printed circuit board 17, lamination of the chip carrier 22 is performed at the reduced temperature of 120–250° C. and pressure of 100–700 psi. Again, this is due to the presence of the thermosetting resin 12.

As further shown in FIG. 6, thermosetting resin solder mask 12' is selectively disposed between the solder connectors 26 and the electrically conductive pads 30 as well as along the underside of chip carrier 22. These are the normal positions where a solder mask would be positioned. The solder mask aids in strengthening the junction between the integrated circuit chip 24 and the chip carrier 22 as well as the junction between the chip carrier 22 and the underlying substrate (not shown). The junction between the circuit chip 24 and the chip carrier 22 is often referred to as the flip-chip or as the controlled collapse chip connection or C4. Moreover, the reliability of the chip carrier 22 under thermal cycling can be enhanced by using the thermosetting resin of the present invention as a solder mask. Alternatively, the thermosetting resin 12 can be supplied with various inorganic fillers for this application to alter its mechanical and thermal properties.

Figure 7:
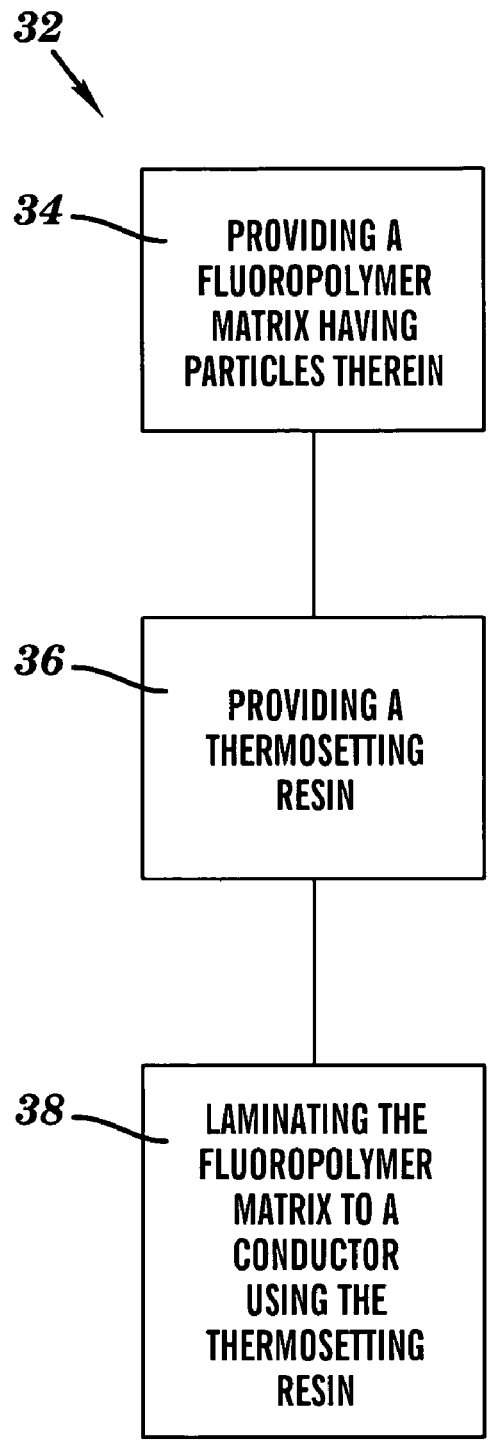
FIG. 7 is a flow chart of a method according to the present invention.
Figure 8:
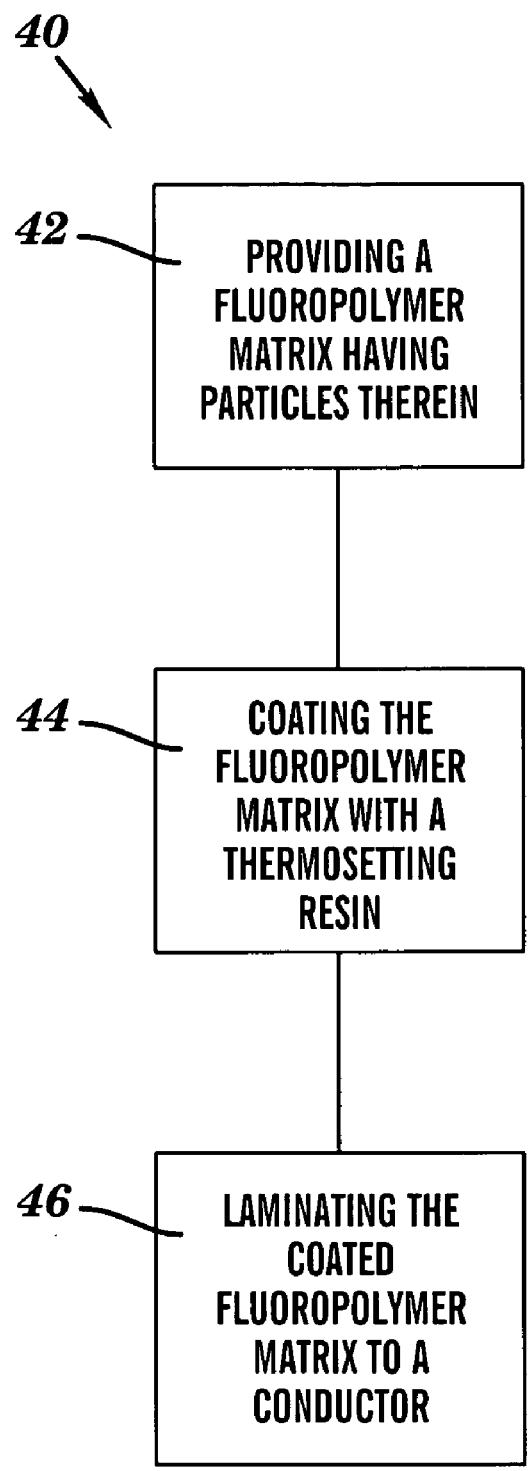
FIG. 8 is a flow chart of an alternative method according to the present invention.

FIGS. 7 and 8 show two methods of forming a device using the materials described above. Referring first to FIG. 7, the first step 34 of method 32 is to provide a fluoropolymer matrix 10 having particles 14 therein. The next step 36 is to provide a thermosetting resin 12. The final step 38, is to laminate the fluoropolymer matrix 10 to a conductor 16 using the thermosetting resin 12. This method allows for the formation of either the printed circuit board 17, the integrated circuit chip carrier 22, or the like using either the filled body 9 coated with thermosetting resin, or the article 10A already having thermosetting resin impregnated therein.

Next, referring to FIG. 8, the first step 42 of the method 40 is to provide a fluoropolymer matrix having particles therein. Next 44, the fluoropolymer matrix is coated with a thermosetting resin. Finally 46, the coated fluoropolymer matrix is laminated to a conductor. Once again, these steps allow for the formation of the printed circuit board 17, the integrated circuit chip carrier 22, or the like using either the filled body 9 coated with the thermosetting resin or the article 10A that was coated with thermosetting resin, as described above.

The methods and structures described above include or result in a dielectric material that has optimal characteristics.

The foregoing description of the preferred embodiments of this invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of this invention as defined by the accompanying claims.

The invention claimed is:

1. A method for forming a device, comprising the steps of:
providing a non-fibrillated fluoropolymer matrix having particles therein, the matrix formed by casting a dispersion in which both the fluoropolymer matrix and inorganic particles are introduced in a liquid;
coating a first resin comprising a thermosetting resin on the fluoropolymer matrix;
processing the fluoropolymer matrix with the first resin coated thereon such that thermosetting resin from the first resin impregnates the fluoropolymer matrix, leaving a remaining layer of resin on a surface of the fluoropolymer matrix, wherein the remaining layer of resin comprises thermosetting resin of the first resin that has not impregnated the fluoropolymer matrix;
coating a second resin comprising the thermosetting resin on a surface of a conductor; and laminating the resin-impregnated fluoropolymer matrix to the conductor having the second resin thereon, wherein the conductor, thermosetting resin of the second resin, and the remaining layer of resin are disposed on the resin-impregnated fluoropolymer matrix following the laminating step.

2. The method of claim 1, wherein the particles are inorganic particles each having a spherical shape and a diameter of less than 10 microns.

3. The method of claim 1, wherein the device is a printed circuit board or a chip carrier.

4. The method of claim 1, wherein the thermosetting resin includes solvent comprising methyl ethyl ketone.

5. The method of claim 1, wherein the step of coating the first resin comprises coating a varnish comprising the first resin on the fluoropolymer matrix, wherein prior to the step of coating the varnish the method comprises the step of adjusting the viscosity of the varnish so as to control a degree to which the thermosetting resin in the varnish impregnates the fluoropolymer matrix during the processing step.

6. The method of claim 1, wherein the thermosetting resin includes a contrasting dye.

* * * * *